(12) United States Patent
Rudeck (10) Patent No.: US 7,420,240 B2
(45) Date of Patent: Sep. 2, 2008

(54) METHOD TO REMOVE AN OXIDE SEAM ALONG GATE STACK EDGE, WHEN NITRIDE SPACE FORMATION BEGINS WITH AN OXIDE LINER SURROUNDING GATE STACK

(75) Inventor: Paul J. Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/626,620

(22) Filed: Jul. 25, 2003

(65) Prior Publication Data

US 2005/0098820 A1 May 12, 2005

Related U.S. Application Data

(62) Division of application No. 10/213,086, filed on Aug. 7, 2002, now Pat. No. 6,713,350.

(51) Int. Cl.
*H01L 21/00* (2006.01)
(52) U.S. Cl. .................. 257/314; 257/315; 257/316
(58) Field of Classification Search .......... 257/314–316
See application file for complete search history.

(56) References Cited

U.S. PATENT DOCUMENTS

| | | | | | |
|---|---|---|---|---|---|
| 5,631,179 | A | * | 5/1997 | Sung et al. | 438/264 |
| 5,814,862 | A | * | 9/1998 | Sung et al. | 257/344 |
| 6,083,828 | A | | 7/2000 | Lin et al. | |
| 6,383,878 | B1 | | 5/2002 | Huang | |
| 6,541,815 | B1 | * | 4/2003 | Mandelman et al. | 257/315 |
| 6,555,865 | B2 | * | 4/2003 | Lee et al. | 257/314 |
| 6,605,840 | B1 | * | 8/2003 | Wu | 257/315 |
| 6,613,657 | B1 | * | 9/2003 | Ngo et al. | 438/588 |
| 6,689,658 | B2 | * | 2/2004 | Wu | 438/257 |
| 6,713,350 | B2 | * | 3/2004 | Rudeck | 438/261 |
| 6,746,906 | B2 | * | 6/2004 | Rabkin et al. | 438/199 |
| 6,747,310 | B2 | * | 6/2004 | Fan et al. | 257/320 |
| 6,777,291 | B2 | * | 8/2004 | Rudeck et al. | 438/257 |
| 6,803,624 | B2 | * | 10/2004 | Rudeck et al. | 257/315 |
| 6,809,402 | B1 | * | 10/2004 | Hopper et al. | 257/647 |
| 6,833,581 | B1 | * | 12/2004 | Hui et al. | 257/317 |
| 6,873,005 | B2 | * | 3/2005 | Rudeck et al. | 257/315 |
| 7,015,111 | B2 | * | 3/2006 | Rudeck et al. | 438/423 |
| 7,091,549 | B2 | * | 8/2006 | Rudeck et al. | 257/315 |
| 7,115,458 | B2 | * | 10/2006 | Rudeck | 438/201 |
| 7,148,547 | B2 | * | 12/2006 | Rudeck | 257/390 |
| 7,294,567 | B2 | * | 11/2007 | Rudeck | 438/618 |
| 2002/0195686 | A1 | | 12/2002 | Kim et al. | |

(Continued)

*Primary Examiner*—Laura M Schillinger
(74) *Attorney, Agent, or Firm*—Dickstein Shapiro LLP (57) ABSTRACT

An exposed top end of a vertical oxide spacer is removed, and a nitride layer is deposited in an amount sufficient to replace the removed portion prior to exposing a memory device to a self align contact etch process. The nitride layer may be used to prevent a short circuit through the oxide spacer. The present invention also provides memory devices that have a gate stack, a vertical spacer adjacent to the gate stack, in which the vertical spacer has a lower portion comprising an oxide and an upper portion comprising a nitride, and a continuous nitride layer overlaying the vertical spacer and the gate stack. The present invention further provides methods of fabricating the above devices, and processor systems which include the devices.

16 Claims, 7 Drawing Sheets

U.S. PATENT DOCUMENTS

| | | | |
|---|---|---|---|
| 2003/0170954 A1* | 9/2003 | Rudeck | 438/266 |
| 2004/0004243 A1* | 1/2004 | Rudeck et al. | 257/314 |
| 2004/0005760 A1* | 1/2004 | Rudeck et al. | 438/257 |
| 2004/0029319 A1* | 2/2004 | Rudeck | 438/142 |
| 2004/0152268 A1* | 8/2004 | Chu et al. | 438/266 |
| 2004/0201060 A1* | 10/2004 | Rudeck et al. | 257/315 |
| 2005/0026350 A1* | 2/2005 | Rudeck et al. | 438/222 |
| 2005/0090061 A1* | 4/2005 | Rudeck et al. | 438/262 |
| 2005/0098820 A1* | 5/2005 | Rudeck | 257/314 |
| 2005/0098825 A1* | 5/2005 | Rudeck et al. | 257/321 |
| 2006/0043458 A1* | 3/2006 | Rudeck | 257/315 |
| 2006/0166460 A1* | 7/2006 | Rudeck et al. | 438/439 |
| 2006/0237800 A1* | 10/2006 | Rudeck | 257/384 |
| 2006/0267070 A1* | 11/2006 | Rudeck | 257/314 |
| 2007/0238237 A1* | 10/2007 | Lee et al. | 438/197 |

* cited by examiner

METHOD TO REMOVE AN OXIDE SEAM ALONG GATE STACK EDGE, WHEN NITRIDE SPACE FORMATION BEGINS WITH AN OXIDE LINER SURROUNDING GATE STACK

This application is a divisional of application Ser. No. 10/213,086, filed on Aug. 7, 2002, now U.S. Pat. No. 6,713,350 which is incorporated herein by reference.

FIELD OF THE INVENTION

The present invention relates generally to the field of semiconductor integrated circuits and, more particularly, to the use of self-align contact etch processes in the fabrication of memory devices.

BACKGROUND OF THE INVENTION

The semiconductor industry requires processes for achieving higher device density within a given die area. This is particularly true in memory circuit fabrication, in which the number and density of memory cells on a given chip have dramatically increased. The increase in density is a result of downsizing of the individual semiconductor devices, due partly to advances in photolithography and directional (anisotropic) plasma etching. As the horizontal device feature sizes continue to decrease to submicron dimensions, it is necessary to use self-alignment techniques to relax the alignment requirements and improve critical dimension (CD) control. One such technique is called a self-align contact (SAC) etch, in which a pair of adjacent gate stacks are utilized to align an etched opening in an insulating layer.

A conventional SAC process includes first providing a substrate on which there are at least two memory cells (such as MOS devices or flash memory cells), then forming an insulating layer, such as silicon oxide, on the substrate. Each of the two or more memory cells includes a polysilicon gate and spacers on the sidewalls of the gate. The two cells have a common source/drain region located between the gates of the cells. The insulating layer is patterned to form a self-align contact opening which exposes the common source/drain region. A conductive layer is deposited in the self align contact opening to form a contact. SAC etch processes primarily involve dry or plasma etches, typically utilizing a $C_xF_y$ (x>1)-type plasma chemistry, such as, for example $C_4F_8$, $C_5F_8$, or $C_4F_6$ in combination with other diluent gases.

The increase in packing density also places increased demands on many aspects of the fabrication process. Alignment of features from one level to the next is critically important, particularly the alignment of contact holes with underlying structures. The miniaturization of the devices makes the formation of interconnect structures difficult. To maintain sufficient electrical communication, the interconnect structure must be formed in precise alignment with the underlying active region. At the same time, the area of the interconnect structure interfacing with the active area must be maximized. Thus, as device sizes decrease, there is less room for misalignment errors of the interconnect structure.

Figure 1:
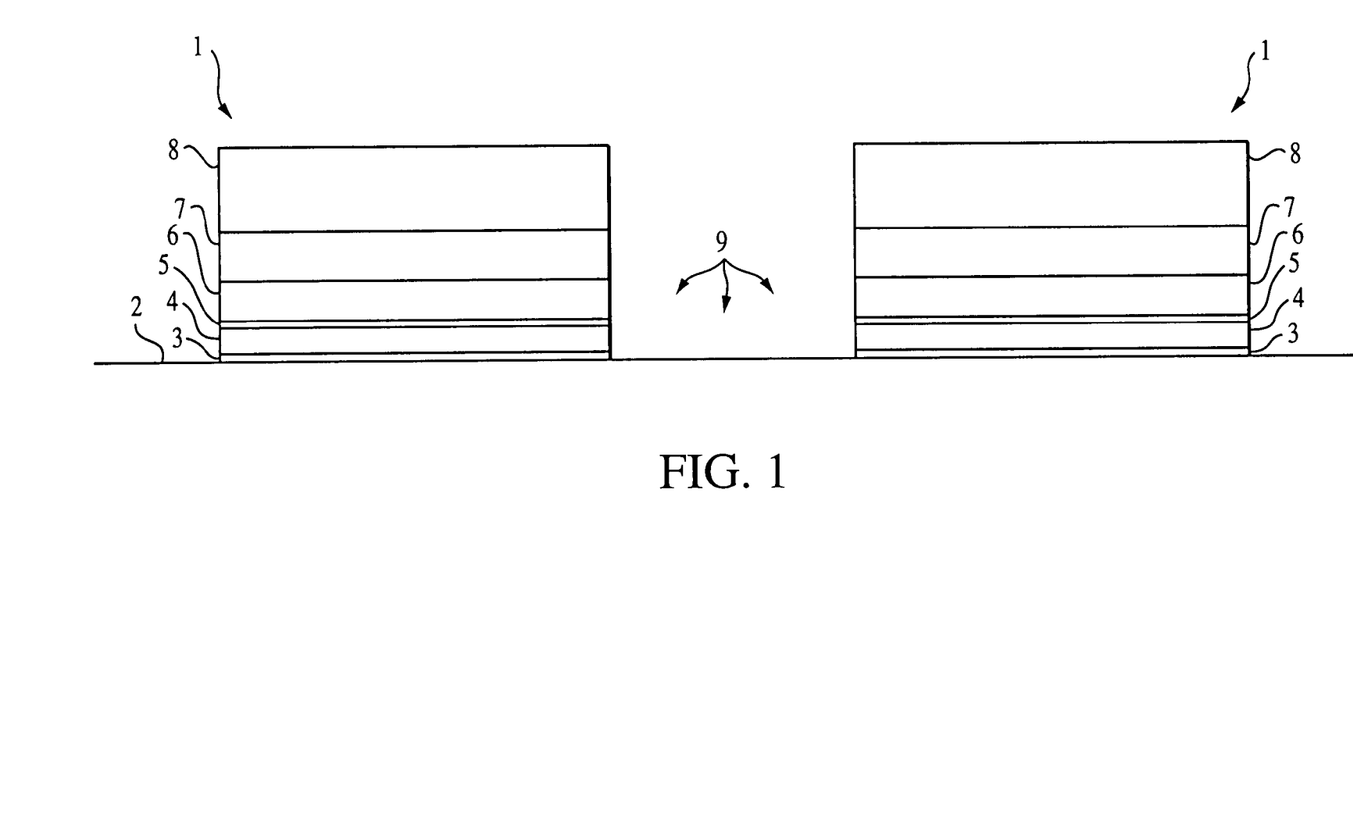
FIG. 1 is a cross sectional view of a semiconductor device with a pair of gate stacks positioned on a substrate.

Moreover, misalignment during an etch process can create problems resulting from the unintended etching or removal of an oxide seam (or spacer) along a gate stack, which forms between the gate stack and nitride spacers when spacer process formation includes the deposition of an oxide liner. In a flash cell, for example, if the misaligned SAC etch removes the oxide seam, metal will be deposited during subsequent plug fill metallization steps into the space where the seam previously was located, thereby causing the control to become shorted to both the floating gate and the substrate. FIGS. 1-3 illustrate this problem.

FIG. 1 depicts a pair of typical flash cell gate stacks 1 positioned adjacent to each other on a substrate 2 at an intermediate stage prior to SAC etching. Each stack includes a tunnel oxide layer 3 positioned on top of the substrate 2. A polysilicon floating gate 4 is positioned on top of the tunnel oxide layer 3 and an oxide/nitride/oxide (ONO) layer 5 is positioned on top of floating gate 4. A polysilicon control gate 6 is typically formed on top of the ONO layer 5 with a tungsten silicide layer 7 formed on top of the control gate 6. A cap 8, which is typically either nitride or TEOS is positioned on the tungsten silicide layer 7. Between the gate stacks is the area 9 in which the contact will be etched into the substrate.

Figure 2A:
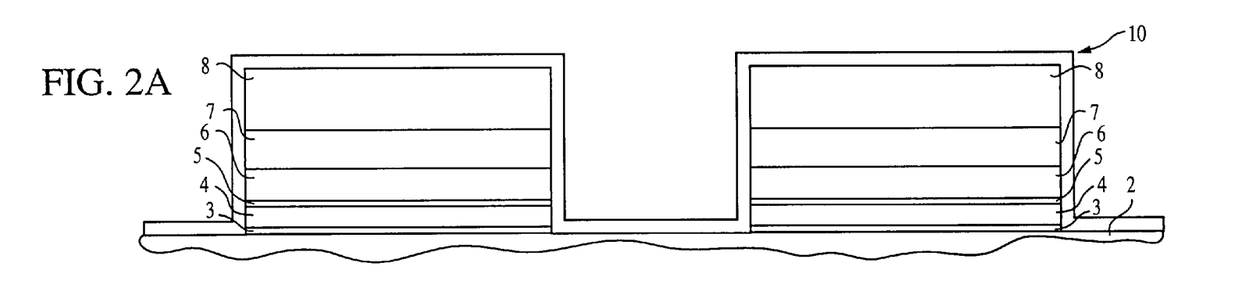
FIGS. 2A-2D are cross sectional views of the device of FIG. 1, showing processing steps in which oxide spacers are formed.
Figure 2B:
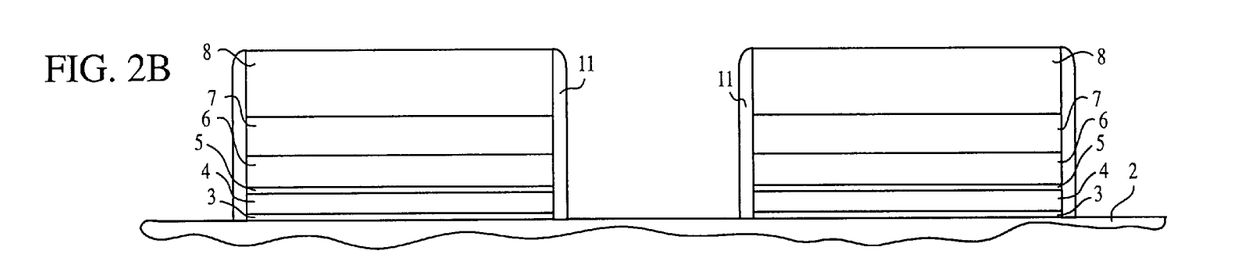
Figure 2C:
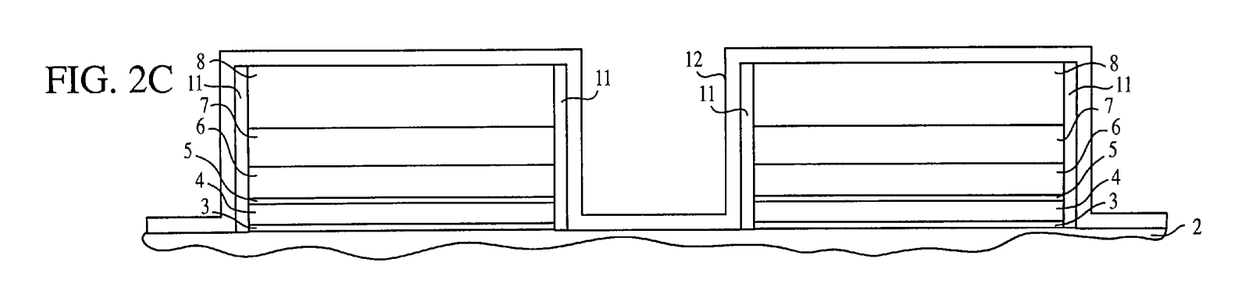
Figure 2D:
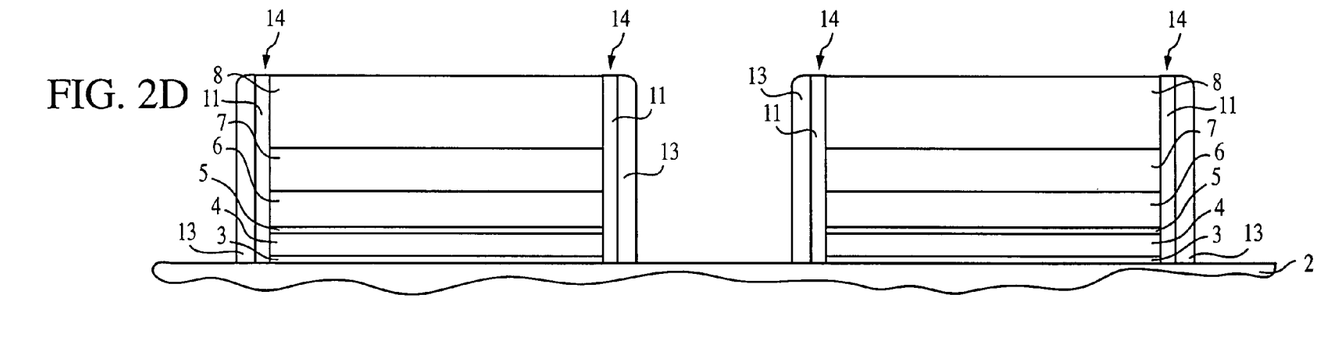
Figure 3:
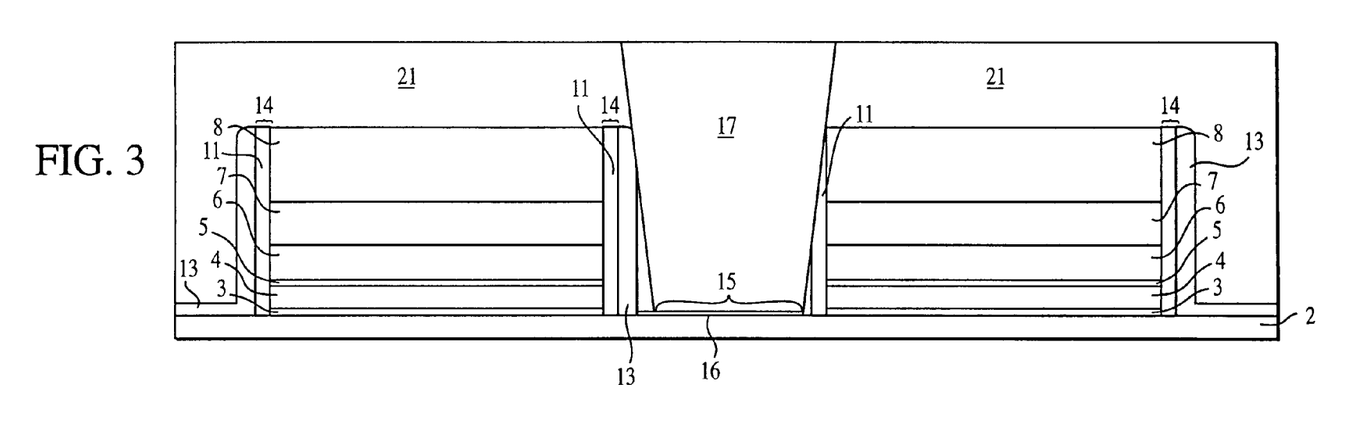
FIG. 3 is a cross sectional view of the semiconductor device of FIG. 1, with an oxide spacer removed by a self-align contact etch process.

FIGS. 2A-2D illustrate processing steps that may be performed subsequent to the intermediate stage illustrated in FIG. 1. First, an oxide layer 10, preferably a TEOS layer with a thickness of between about 50 Å and about 300 Å, more preferably, 100 and 200 Angstroms, is deposited over the surface of the device (FIG. 2A), to include sidewall S/D oxidation. Next, dry etching is used to remove horizontal TEOS surfaces, leaving vertical surfaces to form oxide spacers (also referred to herein as seams) 11, along the gate stack edge (FIG. 2B). To form a nitride spacer, a nitride layer 12 is deposited over the surface of the device, as shown in FIG. 2C. To complete nitride spacer formation, a dry etch is used, resulting in gate stacks having oxide seams (spacers) 11 separating nitride spacers 13 from gate stack 1 (FIG. 2D). The oxide seams 11 are exposed at the top 14, which can present a problem during the subsequent SAC etch process.

Following a first dielectric layer deposition, a self-align contact etch is used to remove the dielectric from the common region between the gate stacks to prepare the contact region 15 for metal deposition. FIG. 3 illustrates a problem that occurs when the self-align contact etch 17 is misaligned so as to hit a gate stack, rather than merely the contact region between adjacent gate stacks. Because the first level dielectric 16 and the exposed oxide seam 11 are composed of the same material, the etch plasma chemistry, which is selective to this material, etches out the oxide seam as well as the intended dielectric, leaving a void where the seam was. Once the seam is etched out, the resulting void would then be filled with metal. Because the metal deposited in the vertical space where the oxide seam had been is conductive, the control gate would be shorted to the floating gate and to the substrate (in a flash memory cell for example), or the gate would be shorted to the substrate (in a device other than a flash cell, such as, for example, a standard MOS transistor). This shorting results in a non-functional device.

There is thus a need for a method which mitigates or eliminates the above disadvantages. In particular, there is a need for a method which prevents problems, such as shorting between gate stack components, that occur when a misaligned self-align contact etch unintentionally removes an oxide seam or spacer.

SUMMARY OF THE INVENTION

The present invention provides methods of preventing a short from occurring in a gate stack during a self-align contact etch process. According to one aspect of the invention, a memory device has at least two adjacent gate stacks positioned on a substrate. Each of the stacks is separated from a vertical nitride spacer by a vertical oxide spacer exposed at its top end. A portion of the vertical oxide spacer is removed from its exposed top end, a nitride layer is formed over the memory device sufficient to replace the removed portion, and then the memory device is exposed to a self-align contact etch process.

The present invention also relates to a memory device that has a gate stack, a vertical spacer adjacent to the gate stack, in which the vertical spacer has a lower oxide portion and an upper nitride portion, and a continuous nitride layer overlaying the spacer and the gate stack.

The present invention also relates to a method of fabricating memory devices. A preferred embodiment of the invention includes the steps of forming a continuous oxide layer over a gate stack positioned on a substrate, the continuous oxide layer having horizontal and vertical surfaces, removing the horizontal surfaces of the continuous oxide layer, and forming a first continuous nitride layer over the gate stack, the vertical oxide surfaces and the substrate. In the preferred embodiment, the first continuous nitride layer has horizontal and vertical surfaces, with each vertical oxide surface thereby becoming an oxide spacer. The present invention may also include the steps of removing the horizontal surfaces of the first continuous nitride layer, thereby exposing each oxide spacer at its top end, removing a portion of the oxide spacer from its top end, and depositing an amount of nitride to replace the removed portion.

These and other features and advantages of the invention will be more clearly understood from the following detailed description, which is provided with reference to the accompanying drawings.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The terms "substrate" and "wafer" are used interchangeably in the following description and may include a variety of semiconductor-based structures. The structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but metal with other trace metals or in various alloyed combinations with other metals as known in the semiconductor art, as long as such alloy retains the physical and chemical properties of the metal.

As used herein, unless otherwise noted, the terms oxide seam and oxide spacer are used interchangeably.

As used herein, "horizontal" means substantially parallel to the substrate, and "vertical" means substantially perpendicular to the substrate.

No particular order is required for the method steps described below, with the exception of those logically requiring the results of prior steps. Accordingly, while many of the steps discussed below are discussed as being performed in an exemplary order, this order may be altered.

The present invention relates to a method of preventing a short from occurring in a gate stack during a self-align contact etch process. In a preferred embodiment, the method includes the steps of providing a memory device having at least two adjacent gate stacks positioned on a substrate, wherein each of said adjacent gate stacks is separated from a vertical nitride spacer by a vertical oxide spacer exposed at its top end, and removing a portion of the vertical oxide spacer from its exposed top end. A nitride layer is then formed over the memory device sufficient to replace the removed portion, and the memory device is exposed to a self-align contact etch process. The vertical oxide spacer is preferably between about 100 Angstroms and about 200 Angstroms in thickness (where "thickness" is measured in the horizontal dimension, perpendicular to a major surface of the spacer). The nitride layer preferably has a thickness equal to about one half the width of the vertical oxide spacer (where "thickness" is measured in the horizontal dimension, perpendicular to a major surface of the spacer). The methods described herein may be used in connection with flash cell gate stacks and other gate stacks.

Figure 4:
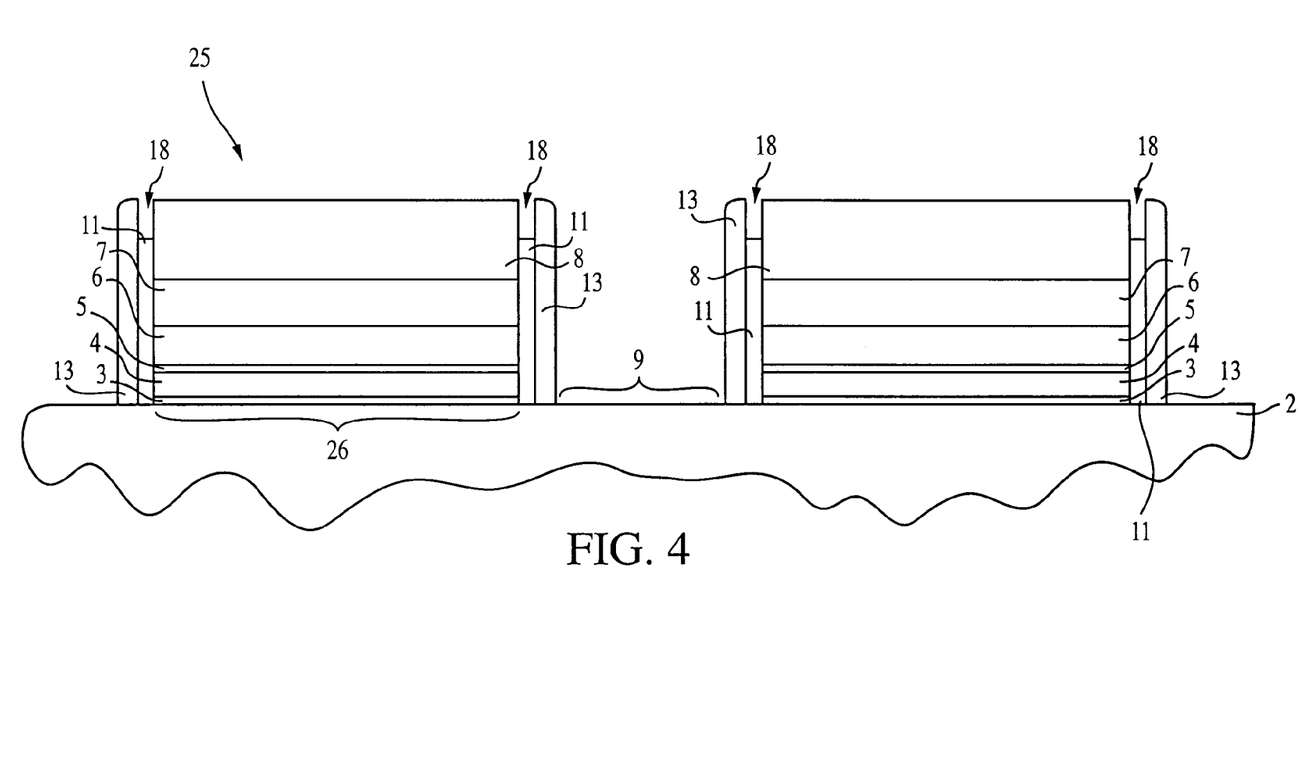
FIG. 4 is a cross sectional view of a semiconductor device constructed in accordance with a preferred embodiment of the present invention, in an intermediate stage of construction.
Figure 5:
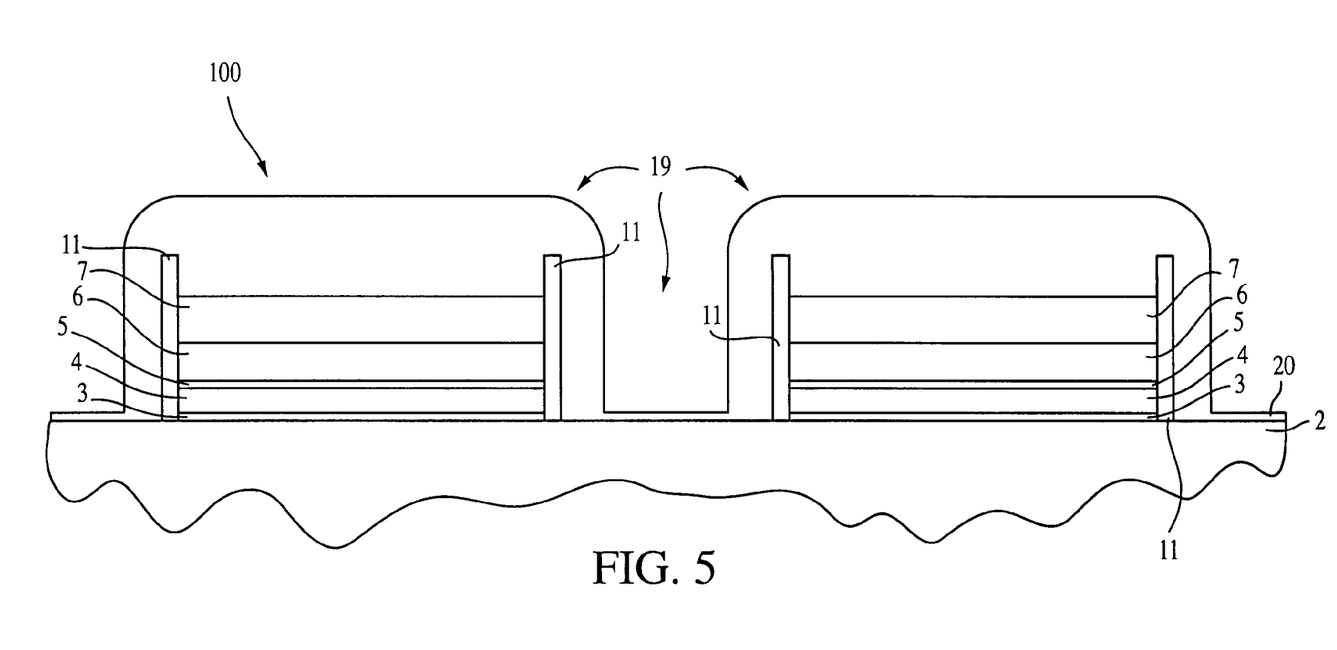
FIG. 5 is a cross sectional view of the device of FIG. 4 in a subsequent stage of construction.
Figure 6:
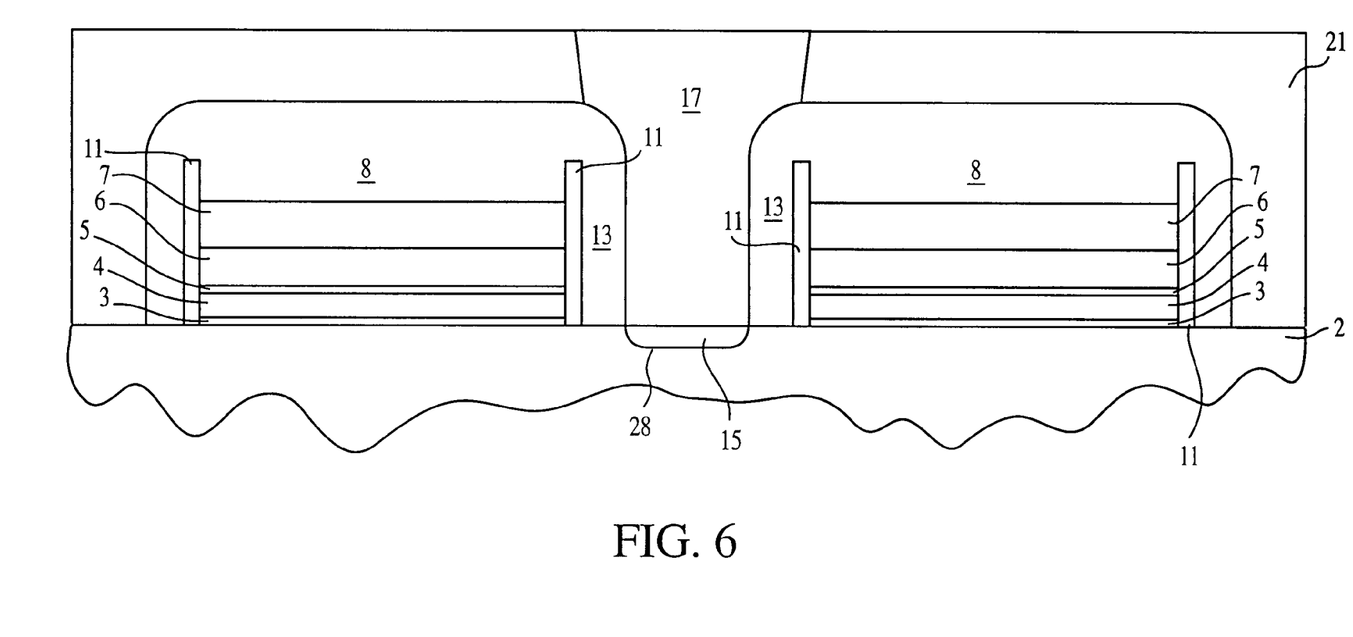
FIG. 6 is a cross sectional view of the device of FIG. 5, in a subsequent stage of construction.

Referring now to the drawings, where like elements are designated by like reference numerals, FIGS. 4-6 illustrate a process in accordance with the present invention which can be employed to prevent the shorting problem illustrated in FIG. 3. A device such as that depicted in FIG. 2D is susceptible to shorting between the floating gate, the control gate and the substrate when a self-align contact etch is misaligned, resulting in a non-functional device.

FIG. 4 depicts a device 25 at a processing stage which is subsequent to the stage shown in FIG. 2D. In FIG. 4, the cap 8 is preferably a nitride cap. The cap 8 is positioned on top of metal layer 7, which is preferably a tungsten silicide. The metal layer 7 is positioned on top of control gate 6, which is preferably a polysilicon layer. The control gate 6 is separated from a floating gate 4. The floating gate 4 is located below the control gate 6. That is, the floating gate 4 is located between the control gate 6 and the substrate 2. The floating gate 4 is preferably a polysilicon layer. An oxide/nitride/oxide (ONO) layer 5 is located between the control gate 6 and the floating gate 4.

The ONO layer 5 separating the control gate 6 from the floating gate 4 preferably comprises a layer of silicon nitride ($Si_3N_4$) interposed between underlying and overlying layers of silicon dioxide ($SiO_2$). The $Si_3N_4$ layer is preferably about 100 Angstroms in thickness. The SiO$_2$ layers are each preferably about 40 Angstroms in thickness. The floating gate 4 is positioned on top of the tunnel oxide layer 3. A contact will be formed in the area 9 between the gate stacks 1. Oxide seam 11 is situated between the gate stack 26 and nitride spacer 13.

A dilute solution of HF in water is preferably used to partially remove or etch back 18 part of the oxide seam 11. This may be achieved by dipping the wafer in an HF bath. Alternately, the oxide seam may be partially etched back by exposing the wafer to the plasma conditions used for the SAC etch process until the desired amount of oxide is removed. Exposing the wafer to the plasma conditions reduces the risk of damaging the tunnel oxide and provides flexibility as to the amount of oxide removed from the seam.

After the seam has been partially removed, a thin film of nitride 19 is deposited over the device 100 as illustrated in FIG. 5. The thickness of the nitride layer 19 is preferably about one half the width of the oxide seam 11. This thickness may be altered but is preferably an amount which is sufficient to fill the etched out portion of the seam with nitride while minimizing the amount of nitride deposited outside the seam. The portion of the layer 20 formed on top of the substrate surface could be used as an etch stop during the SAC process. Alternatively, a short nitride spacer etch is used to remove the newly deposited nitride from the silicon surface, such as layer 20, for example. The duration of the etch preferably is targeted to remove only a thickness equal to the additional nitride.

Referring now to FIG. 6, a first dielectric stack 21 is deposited. The stack 21 is used to support a first metal and isolate the contacts. The dielectric 21 is preferably an undoped glass followed by a doped glass (BPSG). The dielectric is then planarized and etched to form a contact opening 15 between the two gates stack to expose the underlying source/drain region 28. As shown in FIG. 6, if an SAC contact 17 is misaligned, the contact hits the nitride. Because of etch selectivity, the contact plasma becomes directed away from the gates and continues down through the oxide between the nitride spacers 13.

Following the etching, a first conductive layer, preferably Ti/TiN, is deposited, followed preferably by a tungsten (W) deposition. The first level metal is deposited next. Because oxide seam 11 was never exposed during the etch process, no unintended shorting could occur during the subsequent conductive layer and metal deposition steps as described above with reference to FIG. 3.

The invention also relates to memory devices for use in numerous integrated circuit applications. In an embodiment, a memory device has a gate stack, a vertical oxide spacer adjacent to the gate stack, and a continuous nitride layer overlaying the vertical oxide spacer and gate stack. The gate stack may comprise both a floating gate and a control gate. The vertical oxide spacer is preferably TEOS and is preferably between about 50 Å and about 300 Å, and more preferably about 100 and 200 Angstroms in thickness. The nitride spacer preferably has a thickness equal to about one half the width of the vertical oxide spacer. Alternatively, the device may have a vertical spacer which has a lower portion comprising an oxide and an upper portion comprising a nitride. Therefore, when the device is subjected to a self-align contact etch process, the oxide portion of the spacer is protected from the etch plasma chemistry by the overlying nitride. Thus, even if the SAC etch is misaligned, the oxide spacer is not unintentionally removed, and the shorting problem described above will be avoided. This approach would work for any transistor gate stack (not limited to memory devices) in which there is an oxide seam along with a nitride spacer (as described here) and the contacts will be etched using a SAC process, which is based on having high selectivity between oxide and nitride.

The gate stack may include, for example, a tunnel oxide layer on a substrate, a floating gate layer over the tunnel oxide layer, an oxide/nitride/oxide (ONO) layer over the floating gate layer, a control gate layer over the ONO layer, a silicide layer over the control gate layer, and a cap over the silicide layer. Other suitable gate stack constructions may also be employed. Alternatively, the gate stack may not include a floating gate and an ONO layer over the floating gate, but rather a control gate formed over the tunnel oxide.

The devices of the present invention may be formed by providing a gate stack as described above, then forming a continuous oxide layer, preferably comprising TEOS, over the gate stack and the substrate, the layer having horizontal and vertical surfaces. The horizontal surfaces may then be removed, preferably by an etch process, with a continuous nitride layer then being formed over the device, thereby creating oxide spacers positioned between the gate stack and the nitride layer. The horizontal surfaces of the nitride layer are then removed, preferably by etching, thereby exposing each oxide spacer at its top end. A portion of the oxide spacer's top end is then removed and a layer of nitride in an amount sufficient to replace the removed portion is then deposited. The removal is preferably by applying an aqueous HF solution, or alternately by etching. The amount of nitride is preferably a layer with a thickness of about one half the width of the oxide spacer.

Figure 7:
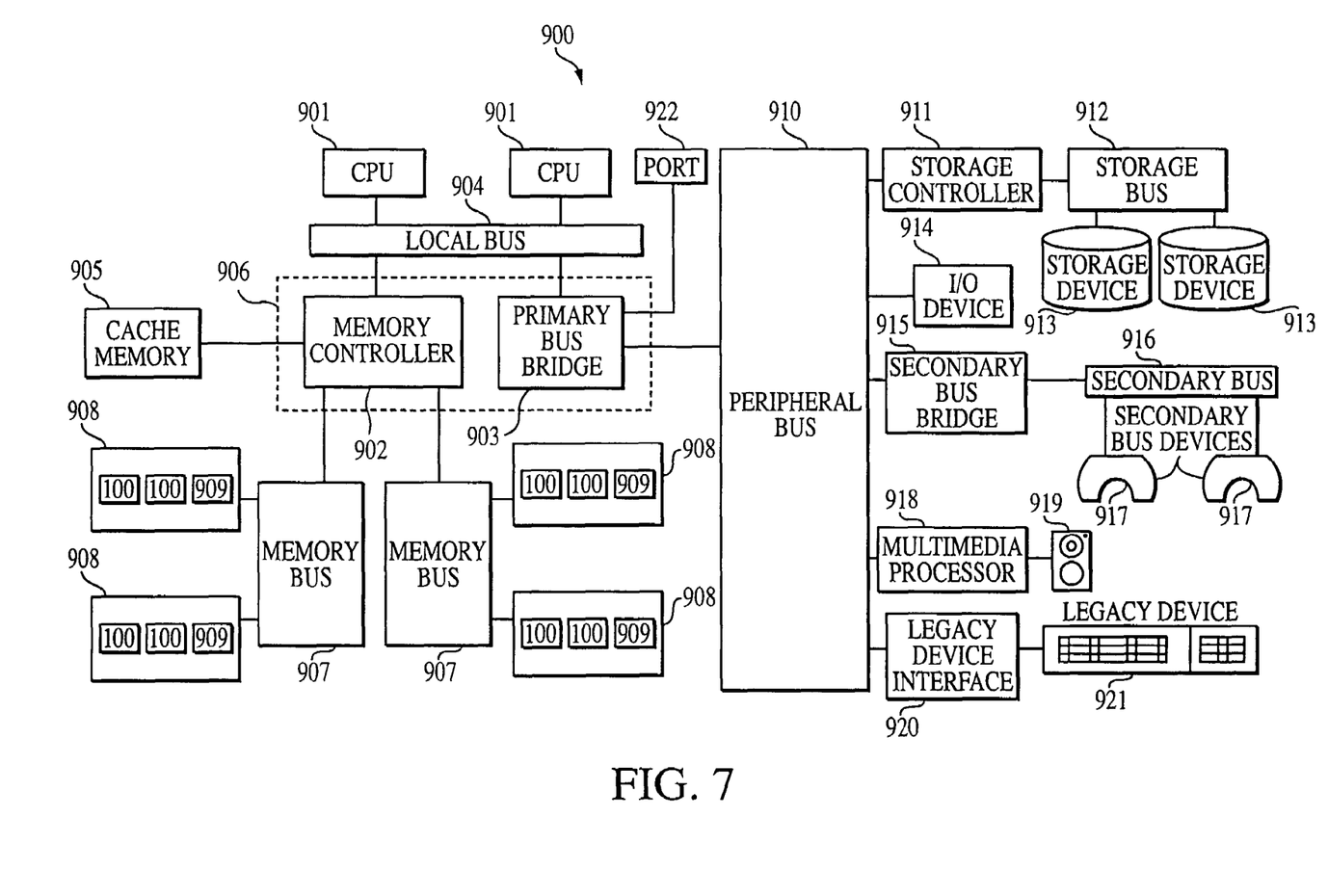
FIG. 7 illustrates a processor system with the device of FIG. 6.

FIG. 7 illustrates an exemplary processing system 900 which may utilize a memory device 25 fabricated in accordance with methods of the present invention. The processing system 900 includes one or more processors 901 coupled to a local bus 904. A memory controller 902 and a primary bus bridge 903 are also coupled to the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be a universal serial port (USB) controller used to couple USB devices 917 via the processing system 900. The multimedia processor 918 may be a sound card, a video capture card, or any other type of media interface, which may also be coupled to one or more additional devices such as speakers 919. The legacy device interface 920 is used to couple legacy devices, for example, older styled keyboards and mice, to the processing system 900.

The processing system 900 illustrated in FIG. 7 is only one exemplary processing system with which the invention may be used. While FIG. 7 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including systems based on the global positioning system (GPS) and/or inertial navigation), and digital cameras and/or recorders. The modifications may include, for example, elimination of unnecessary components, addition of specialized devices or circuits, and/or integration of a plurality of devices.

The above description, examples, and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

The invention claimed is:

1. A memory device comprising:
    a substrate;
    a gate stack pair comprising two gate stacks formed on the substrate; a conductive contact between the two gate stacks and in contact with a doped region of the substrate;
    a pair of vertical oxide spacers adjacent to each gate stack of said gate stack pair;
    a respective nitride layer overlaying and in contact with each said vertical oxide spacer and a top layer of each said gate stack, wherein neither of said nitride layers extends to overlay said doped region and a portion of each said nitride layer is situated between respective vertical oxide spacers; and
    a respective dielectric layer overlaying each said nitride layer, the dielectric layer being spaced from each said vertical oxide spacer by said nitride layer such that said dielectric layer is not in direct contact with said vertical oxide layer,
    wherein the pair of vertical oxide spacers is partially etched back and the respective nitride layers are of a thickness sufficient to fill the etched back portion of a respective one of the pair of vertical oxide spacers.

2. The memory device of claim 1, wherein each gate stack of said gate stack pair comprises a floating gate and a control gate.

3. The memory device of claim 1, wherein each said vertical oxide spacer is between about 50 Å and about 300 Å in thickness.

4. The memory device of claim 1, wherein each said vertical oxide spacer is about 100 Å and about 200 Å in thickness.

5. The memory device of claim 1, wherein each said respective nitride layer has a thickness equal to about one half the width of each said vertical oxide spacer.

6. The memory device of claim 1, wherein the dielectric layer comprises borophosphosilicate glass.

7. The memory device of claim 1, wherein a portion of said nitride layer is in direct contact with a metal layer situated between respective vertical oxide spacers.

8. The memory device of claim 1, wherein the respective vertical oxide spacers comprise a top portion and a bottom portion, the bottom portion being nearer to the substrate than the top portion, and a portion of said nitride layer between respective vertical oxide spacers extends below the top portion of the respective vertical oxide spacers.

9. The memory device of claim 1, wherein the gate stack is configured such that a cross section taken parallel to a surface of the substrate comprises a first portion of the nitride layer, a portion of a first vertical oxide spacer, a second portion of the nitride layer, a portion of a second vertical oxide spacer, and a third portion of the nitride layer.

10. A memory device, comprising:
    a substrate comprising a doped region;
    first and second gate stacks on a surface of the substrate;
    a conductive contact between the first and second gate stacks and in electrical contact with the doped region;
    first and second vertical oxide spacers on opposite sides of the first gate stack;
    third and fourth vertical oxide spacers on opposite sides of the second gate stack;
    a first nitride layer overlaying and in contact with the first and second vertical oxide spacers, wherein a portion of the first nitride layer extends between the first and second vertical oxide spacers;
    a second nitride layer overlaying and in contact with the third and forth vertical oxide spacers, wherein a portion of the second nitride layer extends between the third and fourth vertical oxide spacers; and
    a dielectric material over the first and second gate stacks, wherein the dielectric material is spaced from the vertical oxide spacers by the nitride layer such that the dielectric layer is not in direct contact with the vertical oxide spacers,
    wherein the first, second, third and fourth vertical oxide spacers are partially etched back and the first and second nitride layers are of a thickness sufficient to fill the etched back portion of a respective one of the vertical oxide spacers.

11. The memory device of claim 10, wherein the portion of the first nitride layer between the first and second vertical oxide spacers is in direct contact with a metal layer of the gate stack.

12. The memory device of claim 10, wherein the first and second vertical oxide spacers each comprise a top surface and a bottom surface, the bottom surface being nearer to the substrate than the top surface, and the portion of the first nitride layer between the first and second vertical oxide spacers extends below the top surface of the first and second vertical oxide spacers.

13. The memory device of claim 12, wherein the third and fourth vertical oxide spacers each comprise a top surface and a bottom surface, the bottom surface being nearer to the substrate than the top surface, and the portion of the second nitride layer between the third and fourth vertical oxide spacers extends below the top surface of the third and fourth vertical oxide spacers.

14. The memory device of claim 10, wherein the memory device is configured such that a cross section taken parallel to the top surface of the substrate comprises a first portion of the first nitride layer, a portion of a first vertical oxide spacer, a second portion of the first nitride layer, a portion of a second vertical oxide spacer, and a third portion of the first nitride layer.

15. The memory device of claim 10, wherein a lower surface of the first nitride layer laterally between the first and second vertical oxide spacers is situated below an uppermost surface of the first vertical oxide spacer.

16. The memory device of claim 10, wherein the nitride layers do not extend to overlay the doped region.

\* \* \* \* \*

UNITED STATES PATENT AND TRADEMARK OFFICE
CERTIFICATE OF CORRECTION

| | | |
|---|---|---|
| PATENT NO. | : 7,420,240 B2 | Page 1 of 1 |
| APPLICATION NO. | : 10/626620 | |
| DATED | : September 2, 2008 | |
| INVENTOR(S) | : Rudeck | |

It is certified that error appears in the above-identified patent and that said Letters Patent is hereby corrected as shown below:

In column 8, line 56, in Claim 10, delete "forth" and insert -- fourth --, therefor.

Signed and Sealed this

Fourth Day of November, 2008

JON W. DUDAS
*Director of the United States Patent and Trademark Office*